US012796098B2

(12) United States Patent
Zhang et al.

(10) Patent No.: US 12,796,098 B2
(45) Date of Patent: Nov. 10, 2026

(54) THIN-FILM TRANSISTOR STRUCTURE AND ELECTRONIC DEVICE

(71) Applicant: Shanghai Tianma Micro-electronics Co., Ltd., Shanghai (CN)

(72) Inventors: Kaidi Zhang, Shanghai (CN); Baiquan Lin, Shanghai (CN); Liying Wang, Shanghai (CN); Linzhi Wang, Shanghai (CN); Haotian Lu, Shanghai (CN); Kerui Xi, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 403 days.

(21) Appl. No.: 18/600,804

(22) Filed: Mar. 11, 2024

(65) Prior Publication Data

US 2025/0107232 A1 Mar. 27, 2025

(30) Foreign Application Priority Data

Sep. 26, 2023 (CN) ........................ 202311255107.6

(51) Int. Cl.

| | |
|---|---|
| ***H01L 27/12*** | (2006.01) |
| ***H10D 86/40*** | (2025.01) |
| ***H10D 86/60*** | (2025.01) |

(52) U.S. Cl.

CPC ........... *H10D 86/60* (2025.01); *H10D 86/441* (2025.01)

(58) Field of Classification Search

CPC ............................ H10D 86/60; H10D 86/441

See application file for complete search history.

(56) References Cited

U.S. PATENT DOCUMENTS

| | | | | |
|---|---|---|---|---|
| 11,663,978 B1 * | 5/2023 | Jang | G09G 3/3266 345/204 |
| 2007/0242176 A1 * | 10/2007 | Chang | G02F 1/13624 257/E27.111 |
| 2015/0021598 A1 * | 1/2015 | Ikeda | H10D 30/6755 257/43 |
| 2020/0203535 A1 * | 6/2020 | Choi | H10D 30/6729 |

FOREIGN PATENT DOCUMENTS

CN 105742367 A 7/2016

* cited by examiner

*Primary Examiner* — William C Trapanese

(74) *Attorney, Agent, or Firm* — Anova Law Group, PLLC

(57) ABSTRACT

A thin-film transistor structure and an electronic device are provided. The thin-film transistor structure includes a first transistor and a second transistor. A potential of the signal input electrode of the first transistor is greater than that of the signal receiving component, and the first transistor is turned on; and a potential of the signal input electrode of the second transistor is less than that of the signal receiving component, and the second transistor is turned on; and an overlapping area of the signal output electrode of the first transistor and the etching barrier layer is greater than that of the signal input electrode of the first transistor and the etching barrier layer; and an overlapping area of the signal input electrode of the second transistor and the etching barrier layer is larger than that of the signal output electrode of the second transistor and the etching barrier layer.

16 Claims, 9 Drawing Sheets

THIN-FILM TRANSISTOR STRUCTURE AND ELECTRONIC DEVICE

CROSS-REFERENCE TO RELATED APPLICATION

This application claims the priority of Chinese Patent Application No. 202311255107.6, filed on Sep. 26, 2023, the content of which is incorporated by reference in its entirety.

TECHNICAL FIELD

The present disclosure generally relates to the field of display panel technologies and, more particularly, relates to a thin-film transistor structure and an electronic device.

BACKGROUND

Thin-film transistor structures are widely used in the display field. In the process of using a thin-film transistor structure, a voltage can be applied to the gate to increase the carrier concentration of the active layer of the thin-film transistor structure, thereby achieving the conduction between the source and drain electrodes in the thin-film transistor.

In some usage scenarios, if the drain voltage (Vds) of the thin-film transistor structure is too high, it will cause an avalanche multiplication of carriers in the active layer near the drain electrode side, which will cause the drain current to increase with the drain voltage, and a kink effect occurs, which affects the normal use of the thin-film transistor structure. The present disclosed thin-film transistor structures and electronic devices are direct to solve one or more problems set forth above and other problems in the arts.

SUMMARY

One aspect of the present disclosure provides a thin-film transistor structure. The thin-film transistor structure includes a first transistor and a second transistor. Each of the first transistor and the second transistor includes a gate electrode, a gate insulation layer, an active layer, an etching barrier layer, and a drain metal layer; the gate insulation layer is located above the gate metal layer, the active layer is located above the gate insulation layer, the etching barrier layer is located above the active layer, the drain metal layer is located above the active layer, the drain metal layer is located above the etching barrier layer; the active layer includes a first connection area, a channel area and a second connection area; the first connection area is in contact with a signal input electrode of the drain metal layer, and the second connection area is in contact with a signal output electrode of the drain metal layer; the first transistor and the second transistor are configured to transmit electrical signals to a signal receiving component; a potential of a signal input electrode of the first transistor is greater than a potential of the signal receiving component, and the first transistor is turned on; and a potential of a signal input electrode of the second transistor is less than a potential of the signal receiving component, and the second transistor is turned on; and an overlapping area of the signal output electrode of the first transistor and the etching barrier layer is greater than an overlapping area of the signal input electrode of the first transistor and the etching barrier layer, and an overlapping area of the signal input electrode of the second transistor and the etching barrier layer is larger than an overlapping area of the signal output electrode of the second transistor and the etching barrier layer.

Another aspect of the present disclosure provides an electronic device. The electronic device includes a thin-film transistor structure. The transistor structure includes a first transistor and a second transistor. Each of the first transistor and the second transistor includes a gate electrode, a gate insulation layer, an active layer, an etching barrier layer, and a drain metal layer; the gate insulation layer is located above the gate metal layer, the active layer is located above the gate insulation layer, the etching barrier layer is located above the active layer, the drain metal layer is located above the active layer, the drain metal layer is located above the etching barrier layer; the active layer includes a first connection area, a channel area and a second connection area; the first connection area is in contact with a signal input electrode of the drain metal layer, and the second connection area is in contact with a signal output electrode of the drain metal layer; the first transistor and the second transistor are configured to transmit electrical signals to a signal receiving component; a potential of a signal input electrode of the first transistor is greater than a potential of the signal receiving component, and the first transistor is turned on; and a potential of a signal input electrode of the second transistor is less than a potential of the signal receiving component, and the second transistor is turned on; and an overlapping area of the signal output electrode of the first transistor and the etching barrier layer is greater than an overlapping area of the signal input electrode of the first transistor and the etching barrier layer, and an overlapping area of the signal input electrode of the second transistor and the etching barrier layer is larger than an overlapping area of the signal output electrode of the second transistor and the etching barrier layer.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

DETAILED DESCRIPTION

To understand the above objects, features and advantages of the present disclosure more clearly, the solution of the present disclosure will be further described below. It should be noted that, as long as there is no conflict, the embodiments of the present disclosure and the features in the embodiments can be combined with each other.

Many specific details are set forth in the following description to fully understand the present disclosure, but the present disclosure can also be implemented in other ways different from those described here. Obviously, the embodiments in the description are only part of the embodiments of the present disclosure, and not all examples.

Figure 1:
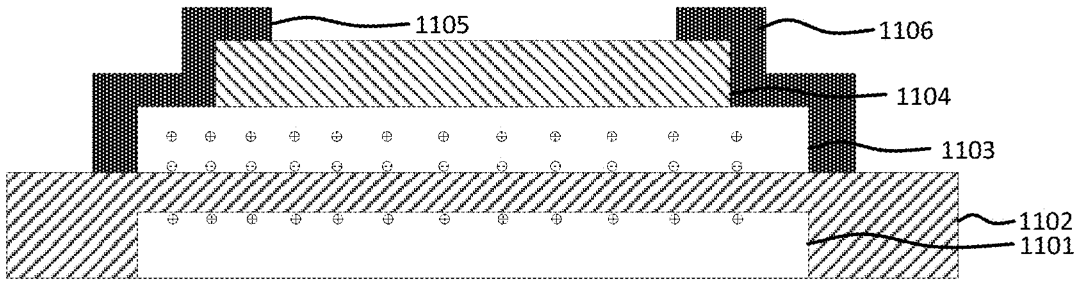
FIG. 1 illustrates the operation mechanism of a thin-film transistor.

FIG. 1 is a schematic diagram of the operation mechanism of a thin-film transistor. For the simplicity of illustration, FIG. 1 only illustrates a portion of the structure of the thin-film transistor, and FIG. 1 takes an N-type transistor as an example for explanation. As shown in FIG. 1, the thin-film transistor at least includes a gate electrode 1101, a gate insulation layer 1102, an active layer 1103, an etching barrier layer 1104, a source electrode 1105, and a drain electrode 1106.

After the gate electrode 1101 applies a high-level, under the action of the gate electrode 1101, the electrons in the active layer 1103 gather toward the side adjacent to the gate electrode 1101. When the level of the gate electrode 1101 is higher than the threshold voltage, an inversion layer is formed in the channel region in the source layer 1103. The concentration of electrons in the inversion layer is greater than the concentration of holes. The source electrode 1105 and the drain electrode 1106 are connected; the thin-film transistor is turned on; and the current flows from the drain electrode 1106 to the source electrode 1105.

However, in some scenarios, if the drain voltage (Vds) of the thin-film transistor is too high, the drain current in the thin-film transistor will increase rapidly as the drain voltage increases, causing a kink effect, which will affect the normal operation of the thin-film transistor structure.

Figure 2:
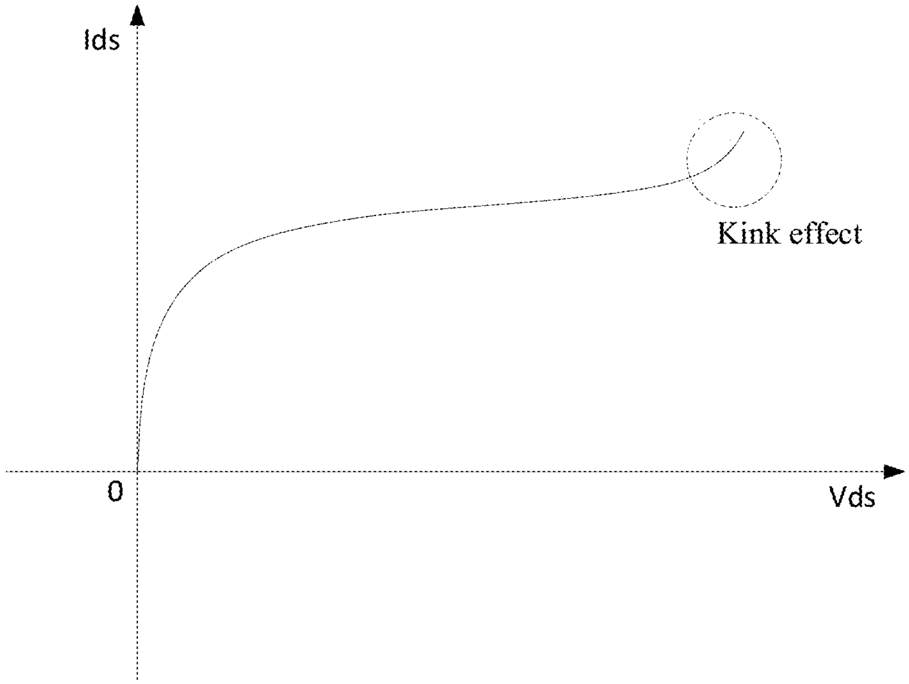
FIG. 2 illustrates a graph of a relationship between leaking currents and leaking voltages when a kink effect is generated in a thin-film transistor.

FIG. 2 is a schematic diagram of the relationship between leakage currents and leakage voltages when a thin-film transistor produces a kink effect. As shown in FIG. 2, when the drain voltage (Vds) is too high, the leakage current (Ids) will increase rapidly.

Figure 3:
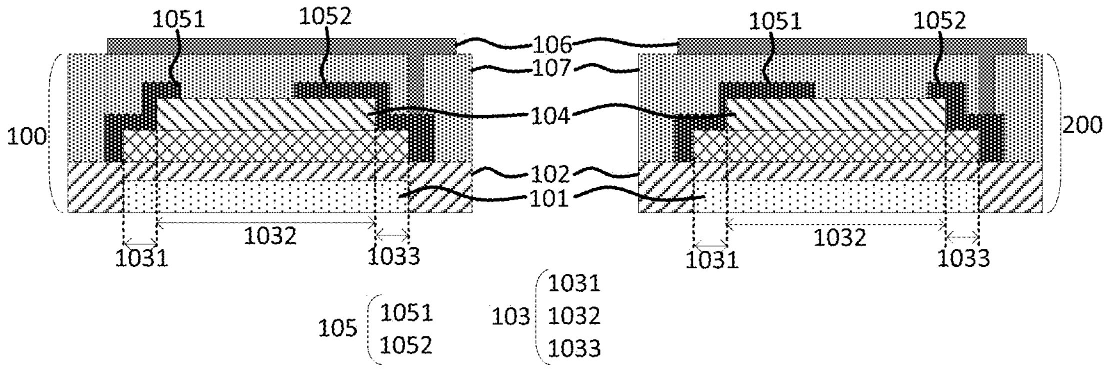
FIG. 3 illustrates an exemplary thin-film transistor structure according to various disclosed embodiments of the present disclosure.

The present disclosure provides a thin-film transistor structure and an electronic device. FIG. 3 is a schematic diagram of an exemplary thin-film transistor structure according to various disclosed embodiments of the present disclosure.

As shown in FIG. 3, the thin-film transistor structure may include a first transistor 100 and a second transistor 200. The first transistor 100 and the second transistor 200 each may include a gate electrode 101, a gate insulation layer 102, an active layer 103, an etching barrier layer 104, and a drain metal layer 105.

The gate insulation layer 102 may be located above the metal layer of the gate electrode 101; the active layer 103 may be located above the gate insulation layer 102; the etching barrier layer 104 may be located above the active layer 103; the drain metal layer 105 may be located above the active layer 103; and the drain metal layer 105 may be located above the etching barrier layer 104. The active layer 103 may include a first connection area 1031, a channel area 1032 and a second connection area 1033. The first connection area 1031 may be in contact with a signal input electrode 1051 of the drain metal layer 105, and the second connection area 1033 may be in contact with a signal output electrode 1052 of the drain metal layer 105.

The first transistor 100 and the second transistor 200 may be configured to transmit electrical signals to a signal receiving component 106. The potential of the signal input electrode 1051 of the first transistor 100 may be greater than the potential of the signal receiving component 106, which may mean that the signal potential to be transmitted by the signal input electrode 1051 of the first transistor 100 may be higher than the potential of the signal receiving component 106. At this time, the first transistor 100 may be turned on, and the first transistor 100 may charge the signal receiving component 106 such that the first transistor 100 may transmit the signal at the signal input electrode 1051 of the first transistor 100 to the signal receiving component 106.

The potential of the signal input electrode 1051 of the second transistor 200 may be lower than the potential of the signal receiving component 106, which may mean that the potential of the signal to be transmitted by the signal input electrode 1051 of the second transistor 200 may be lower than the potential of the signal receiving component 106. At this time, the second transistor 200 may be turned on; and the second transistor 200 may discharge the signal receiving component 106 such that the second transistor 200 may transmit the signal at the signal input electrode 1051 of the second transistor 200 to the signal receiving component 106.

In one embodiment of the present disclosure, the overlapping area of the signal output electrode 1052 of the first transistor 100 and the etching barrier layer 104 may be larger than the overlapping area of the signal input electrode 1051 of the first transistor 100 and the etching barrier layer 104. A capacitance may be formed between the signal output electrode 1052 overlapping the etching barrier layer 104 and the active layer 103. Therefore, the signal output electrode 1052 overlapping the etching barrier layer 104 may be equivalent to forming a top gate above the active layer 103. The potential of the signal input electrode 1051 of the first transistor 100 may be greater than the potential of the signal receiving component 106, which may mean that the signal potential to be transmitted by the signal input electrode 1051 of the first transistor 100 may be higher than the potential of the signal receiving component 106. At this time, the first transistor 100 may be turned on, and the first transistor 100 may charge the signal receiving component 106. When the charging starts, the potential of the signal output electrode 1052 may be smaller than the potential of the signal input electrode 1051, while the overlapping area between the signal output electrode 1052 of the first transistor 100 and the etching barrier layer 104 may be larger than the overlapping area of the signal input electrode 1051 of the first transistor 100 and the etching barrier layer 104. Therefore, most of the channel of the first transistor 100 may be controlled by the signal output electrode 1052, while the potential of the signal output electrode 1052 may be relatively low, thus it may suppress the accumulation of carriers and avoid the kink effect during charging.

In one embodiment, the overlapping area of the signal input electrode 1051 of the second transistor 200 and the etching barrier layer 104 may be greater than the overlapping area of the signal output electrode 1052 of the second transistor 200 and the etching barrier layer 104. A capacitor may be formed between the signal input electrode 1051 overlapping the etching barrier layer 104 and the active layer 103. Therefore, the signal input electrode 1051 overlapping the etching barrier layer 104 may be equivalent to forming a top gate above the active layer 103. The potential of the signal input electrode 1051 of the second transistor 200 may be lower than the potential of the signal receiving component 106, which may mean that the potential of the signal to be transmitted by the signal input electrode 1051 of the second transistor 200 may be lower than the potential of the signal receiving component 106. At this time, the second transistor 200 may be turned on, the second transistor 200 may discharge the signal receiving component 106. At the beginning of the discharging, the potential of the signal input electrode 1051 may be smaller than the potential of the signal output electrode 1052, and the overlapping area of the signal input electrode 1051 of the second transistor 200 and the etching barrier layer 104 may be greater than the overlapping area of the signal output electrode 1052 of the second transistor 200 and the etching barrier layer 104. Thus, the channel of the second transistor 200 may be mostly controlled by the signal input electrode 1051. The potential of the signal input electrode 1051 may be relatively low, thus the accumulation of carriers may be suppressed, and the kink effect occurs during the discharging process may be avoided.

In some embodiments, such as shown in FIG. 1, a planarization layer 107 may be provided between the signal receiving component 106 and the drain metal layer 105.

Figure 4:
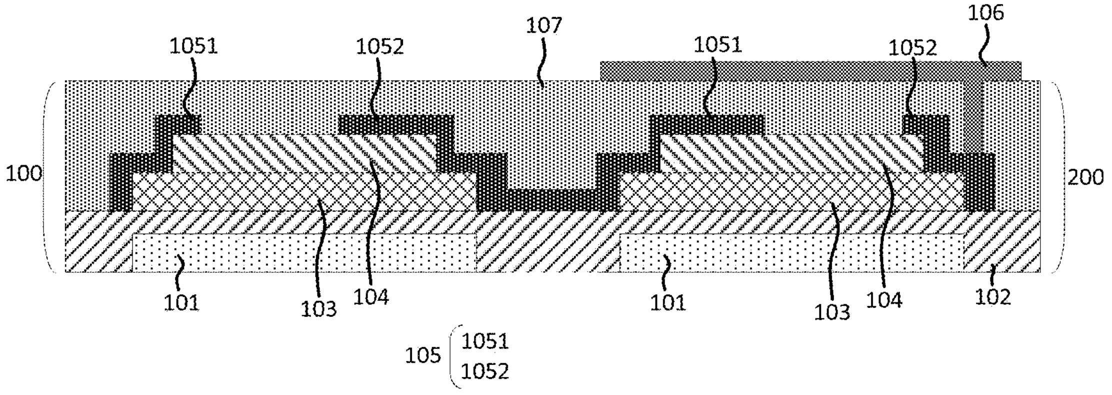
FIG. 4 illustrates another exemplary thin-film transistor structure according to various disclosed embodiments of the present disclosure.
Figure 5:
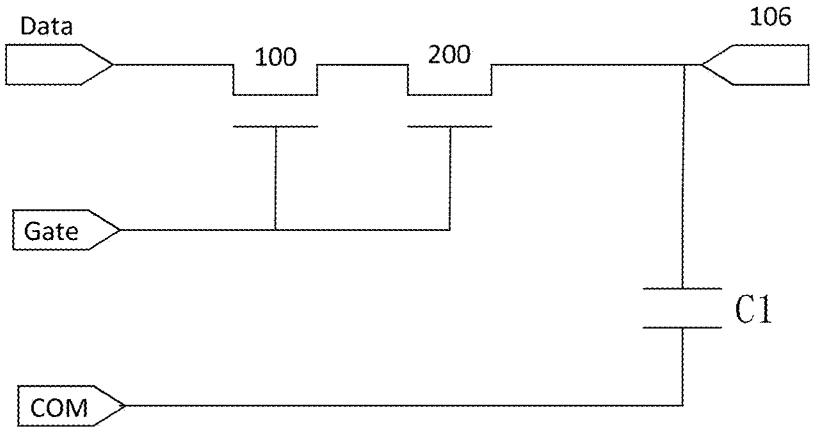
FIG. 5 illustrates an equivalent circuit of the thin-film transistor structure in FIG. 4.

FIG. 4 is a schematic diagram of another exemplary thin-film transistor structure provided by an embodiment of the present disclosure. FIG. 5 is a schematic equivalent circuit diagram of the thin-film transistor structure shown in FIG. 4. In some embodiments, the signal output electrode 1052 of the first transistor 100 and the signal input electrode 1051 of the second transistor 200 may be electrically connected; and the gate electrodes 101 of the first transistor 100 and the second transistor 200 may be electrically connected.

An N-type transistor structure is taken as an example in FIG. 4. In the structure shown in FIG. 4, the first transistor 100 and the second transistor 200 may be connected in series. As shown in FIG. 4, the signal receiving component 106 may be connected to the signal output electrode 1052 of the second transistor 200. The signal receiving component 106 may be, for example, a pixel electrode in the display panel. The signal transmitted by the first transistor 100 to the pixel electrode may be, for example, a data signal. In the equivalent circuit diagram of the embodiment of the present disclosure, the gate is represented as Gate, the signal input electrode transmitting signal is represented as Data, and the COM terminal may represent ground.

Referring to FIGS. 4-5, by controlling the gates of the first transistor 100 and the second transistor 200 and the potential of the signal input electrode 1051 of the first transistor 100 to be greater than the potential of the signal receiving component 106, the first transistor 100 and the second transistor 100 may be turned on to charge the signal receiving component 106. Because the overlapping area of the signal output electrode 1052 of the first transistor 100 and the etching barrier layer 104 may be greater than the overlapping area of the signal input electrode 1051 of the first transistor 100 and the etching barrier layer 104, for the first transistor 100, the active layer 103 may be mostly controlled by the signal output electrode 1052 of the first transistor 100. Further, because the potential of the signal output electrode 1052 of the first transistor 100 may be relatively low at this time, the increase of the carriers in the active layer 103 may be suppressed through the signal output electrode 1052 of the first transistor 100, thereby achieving the purpose of suppressing the kink effect during the charging process. During the process of discharging the signal receiving component 106, the potential of the signal output electrode 1052 of the first transistor 100 may gradually rise, and the Vds of the first transistor 100 (the potential between the signal input electrode 1051 of the first transistor 100 and the signal output electrode 1052 of the first transistor 100) may gradually decrease, making the charging process smoother.

Referring to FIGS. 4-5, by controlling the gates of the first transistor 100 and the second transistor 200 and the potential of the signal input electrode 1051 of the second transistor 200 to be smaller than the potential of the signal receiving component 106, the first transistor 100 and the second transistor 100 may be connected to each other and the second transistor 200 may be turned on. Because the potential of the signal input electrode 1051 of the second transistor 200 may be lower than the potential of the signal receiving component 106, the potential to the signal receiving component 106 may be lower than the current potential of the signal receiving component 106, which may be equivalent to discharging the signal receiving component 106. Because the overlapping area of the signal input electrode 1051 of the second transistor 200 and the etching barrier layer 104 may be smaller than the overlapping area of the signal output electrode 1052 of the second transistor 200 and the etching barrier layer 104, for the second transistor 200, the active layer 103 may be mostly controlled by the signal input electrode 1051 of the second transistor 200, and because the potential of the signal input electrode 1051 of the second transistor 200 may be relatively low at this time, the increase of carriers in the active layer 103 may be suppressed through the signal input electrode 1051 of the second transistor 200 in this process to achieve the purpose of suppressing the kink effect during the discharge process. During the process of discharging the signal receiving component 106, the potential of the signal input electrode 1051 of the second transistor 200 may gradually rise, and the Vds of the second transistor 200 (the voltage between the signal input electrode 1051 of the second transistor 200 and the signal output electrodes 1052 of the second transistor 200) may gradually decrease, thereby making the discharge process smoother.

In one embodiment of the present disclosure, the first transistor and the second transistor may be connected in series. When the signal receiving component is charged, the signal output electrode of the first transistor may suppress the channel current. When the signal receiving component is discharged, the signal input electrode of the second transistor may also suppress the channel current, thereby suppressing the high-voltage kink effect during charging and discharging, and further improving the high-voltage resistance characteristics of the device.

Figure 6:
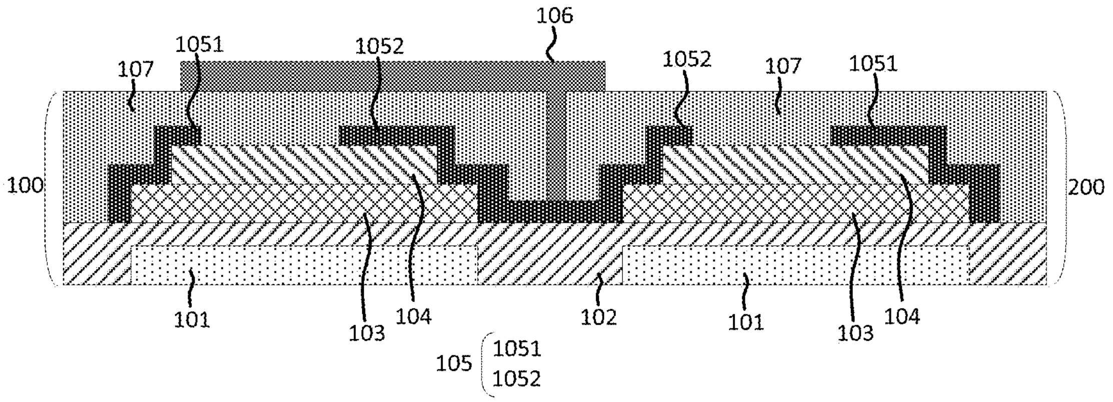
FIG. 6 illustrates another exemplary thin-film transistor structure according to various disclosed embodiments of the present disclosure.

FIG. 6 is a schematic structural diagram of another exemplary thin-film transistor structure according to various disclosed embodiments of the present disclosure. As shown in FIG. 6, in some embodiments, the signal output electrode 1052 of the first transistor 100 may be electrically connected to the signal output electrode 1052 of the second transistor 200. The signal input electrode 1051 may be configured to receive the first voltage signal; the signal input electrode 1051 of the second transistor 200 may be configured to receive the second voltage signal; the gate electrode 101 of the first transistor 100 may be configured to receive the first control signal; and the gate electrode 101 of the second transistor 200 may be configured to receive the second control signal.

Figure 7:
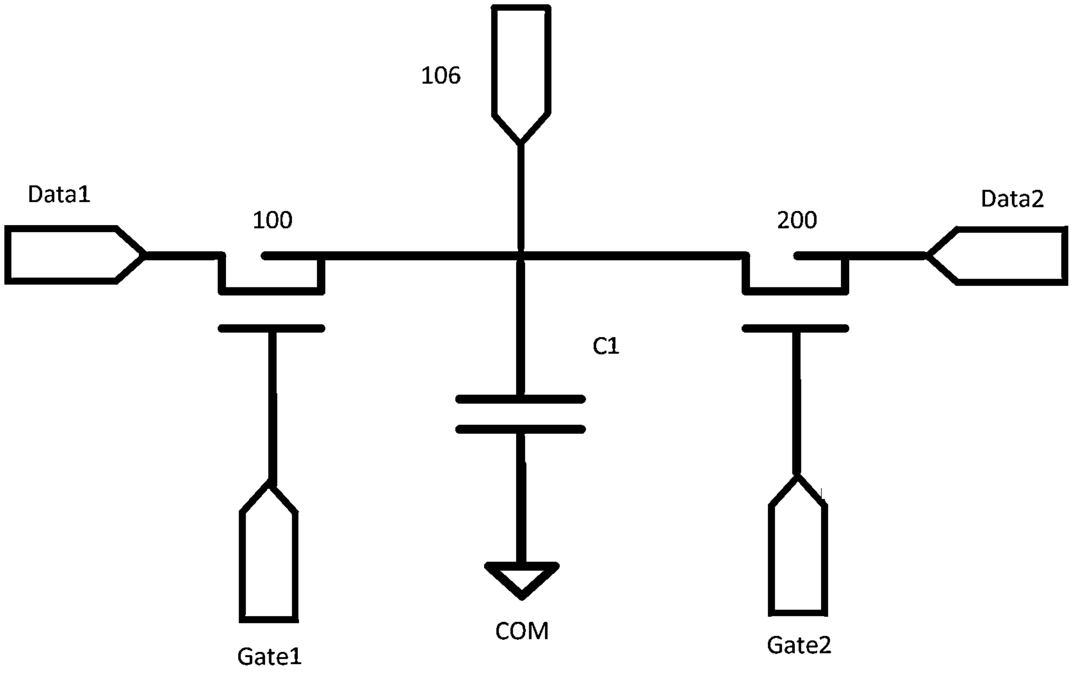
FIG. 7 illustrates an equivalent circuit of the thin-film transistor structure in FIG. 6.

An N-type transistor structure is taken as an example in FIG. 6. In the structure shown in FIG. 6, the first transistor 100 may be configured to charge the signal receiving component 106, and the second transistor 200 may be configured to discharge the signal receiving component 106. FIG. 7 is an exemplary schematic equivalent circuit diagram of the thin-film transistor structure shown in FIG. 6. In FIG. 7, the signal output electrode 1052 of the first transistor 100 and the signal output electrode 1052 of the second transistor 200 may be both electrically connected to the signal receiving component 106.

Referring to FIGS. 6-7, the first transistor 100 may be controlled to be turned on by the first control signal, and the second transistor 200 may be controlled to be turned off by the second control signal. Because when the potential of the signal input electrode 1051 of the first transistor 100 is greater than the potential of the signal receiving component 106, the first transistor 100 may be able to charge the signal receiving component 106. In the early stage of the charging process, the increase of carriers in the active layer 103 may be suppressed through the signal output electrode 1052 of the first transistor 100, thereby achieving the purpose of suppressing the kink effect during the charging process. During the process of charging the signal receiving component 106, the potential of the signal output electrode 1052 of the first transistor 100 may gradually increase, and the Vds of the first transistor 100 (the voltage between the signal input electrode 1051 of the first transistor 100 and the signal output electrode 1052 of the first transistor 100) may gradually decrease, making the charging process smoother.

The first transistor 100 may be controlled to be turned off by the first control signal, and the second transistor 200 may be controlled to be turned on by the second control signal. When the potential of the signal input electrode 1051 of the second transistor 200 is less than the potential of the signal receiving component 106, the second transistor 200 may discharge the signal receiving component 106. In the early stage of the discharging process, the increase of the carriers in the active layer 103 may be suppressed through the signal input electrode 1051 of the second transistor 200, thereby achieving the purpose of suppressing the kink effect during the discharge process. During the process of discharging the signal receiving component 106, the potential of the signal input electrode 1051 of the second transistor 200 may gradually increase, and the Vds of the second transistor 200 (the voltage between the signal input electrode 1051 of the second transistor 200 and the signal output electrodes 1052 of the second transistor 200) may gradually decrease, making the discharge process smoother.

Figure 8:
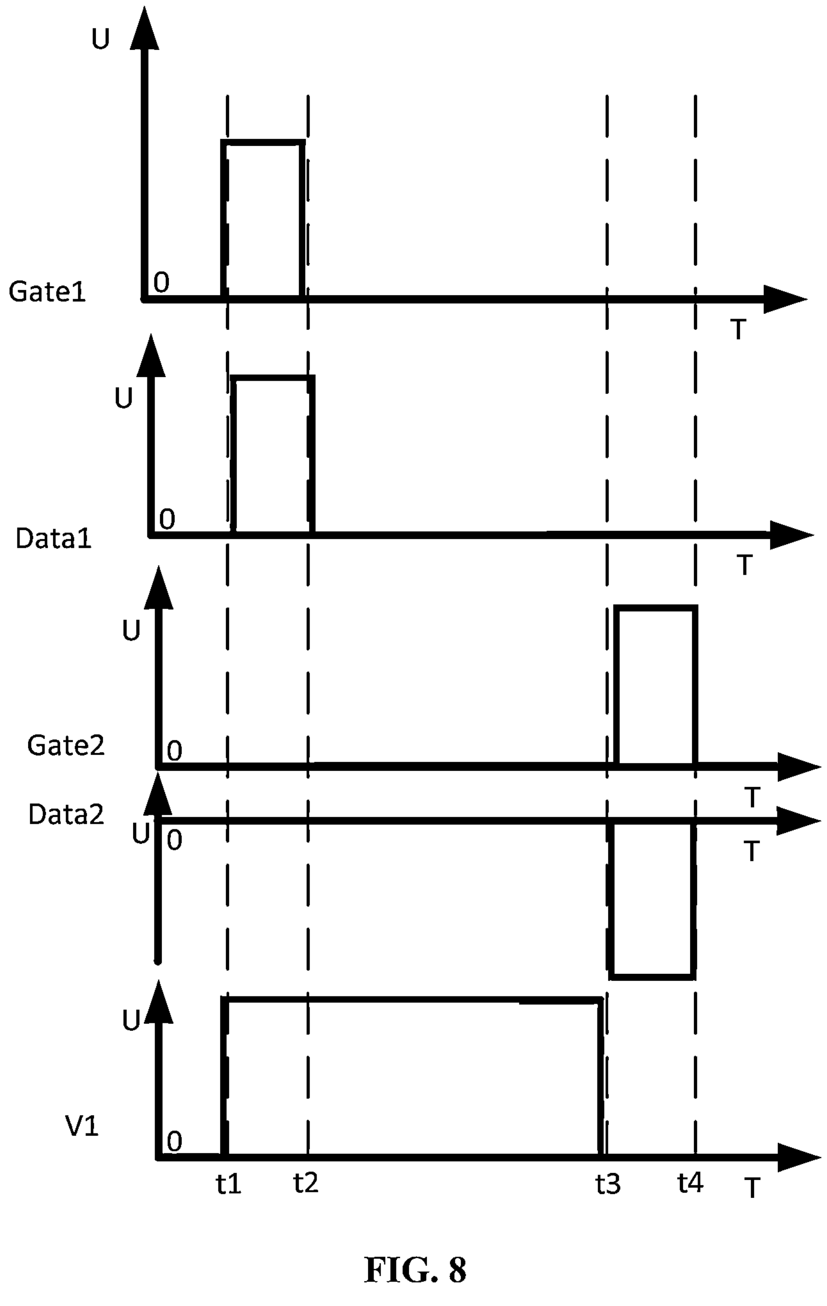
FIG. 8 illustrates an exemplary time sequence according to various disclosed embodiments of the present disclosure.

FIG. 8 is an exemplary schematic time sequence diagram according to various disclosed embodiments of the present disclosure. As shown in FIG. 8, Gate1 may be the first control signal of the gate of the first transistor 100, Data1 may be the input signal of the signal input electrode 1051 of the first transistor 100, Gate2 may be the first control signal of the gate of the second transistor 200, Data2 may be the input signal of the signal input electrode 1051 of the second transistor 200, and V1 may be referred to as the potential of the signal output component. During the process of charging the signal receiving component 106, a high-level signal may be written to the signal input electrode 1051 and the gate electrode 101 of the first transistor 100, and at the same time, the signal input electrode 1051 and the gate electrode 101 of the second transistor 200 may be written with a low-level signal. At this time, the first transistor 100 may be turned on, the second transistor 200 may be turned off, the charging of the signal receiving component 106 may be completed, the corresponding time points may be t1-t2 in FIG. 8. During the process of discharging the signal receiving component 106, a low-level signal may be written to the signal input electrode 1051 and the gate electrode 101 of the first transistor 100, and at the same time, a high-level signal may be written to the gate electrode 101 of the second transistor 200, and a low-level signal may be written to the signal input electrode 1051 of the second transistor 200. At this time, the first transistor 100 may be turned off and the second transistor 200 may be turned on, the discharge of the signal receiving component 106 may be completed; and the corresponding time points may be t3-t4 as shown in FIG. 8.

The embodiments of the present disclosure may perform charging and discharging respectively through two sets of control and input signals, that is, using the first control signal and the first voltage signal to control the first transistor to charge the signal receiving component 106, and using the second control signal and the second voltage signal to control the second transistor to discharge the signal receiving component 106. Accordingly, the current increase during charging and discharging may be suppressed to prevent breakdown.

Figure 9:
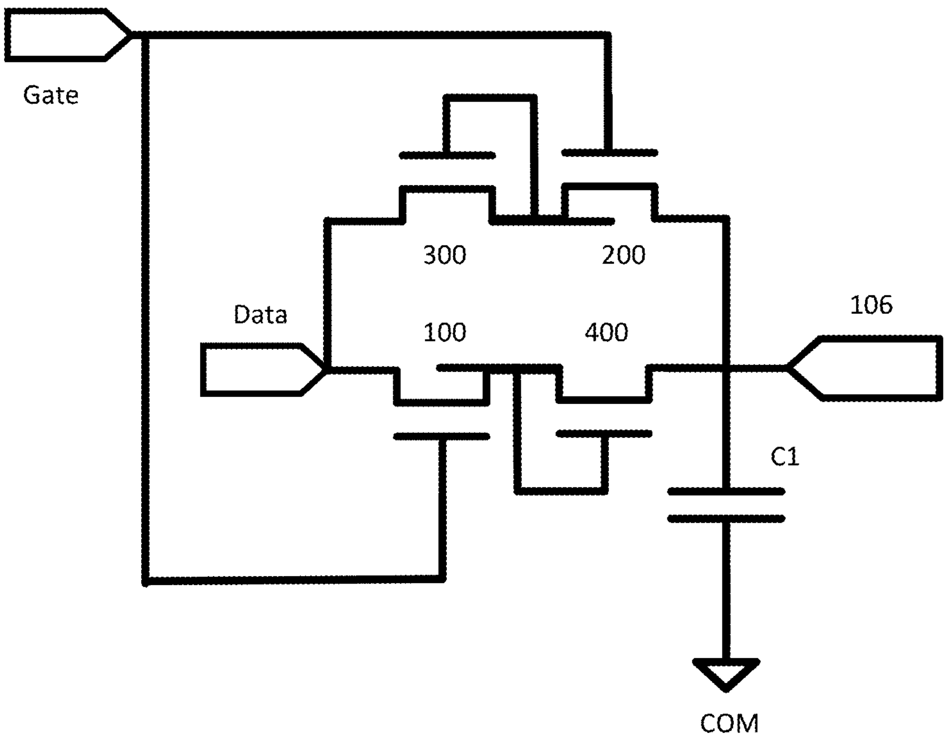
FIG. 9 illustrates another equivalent circuit of an exemplary thin-film transistor structure according to various disclosed embodiments of the present disclosure.

FIG. 9 is a schematic equivalent circuit diagram of another exemplary thin-film transistor structure according to various disclosed embodiments of the present disclosure. As shown in FIG. 9, in some embodiments, the thin-film transistor structure may also include a third transistor 300 and a fourth transistor 400. The signal output electrode of the third transistor 300, the gate electrode of the third transistor 300 and the signal input electrode of the second transistor 200 may be electrically connected. The signal input electrode of the fourth transistor 400, the gate electrode of the fourth transistor 400 and the signal output electrode of the first transistor 100 may be electrically connected. The signal input electrode of the third transistor 300 may be electrically connected to the signal input electrode of the first transistor 100. The signal output electrode of the second transistor 200 may be electrically connected to the signal output electrode of the fourth transistor 400.

The potential of the signal input electrode of the first transistor 100 may be greater than the potential of the signal receiving component 106, the first transistor 100 may be turned on and the fourth transistor 400 may be turned on. The potential of the signal input electrode of the first transistor 100 may be smaller than the potential of the signal receiving component 106, the second transistor 200 and the third transistor 300 may be turned on.

Referring to FIG. 9, the signal input electrode of the fourth transistor 400, the gate electrode of the fourth transistor 400 and the signal output electrode of the first transistor 100 may be electrically connected to realize the series connection of the fourth transistor 400 and the first transistor 100. The signal output electrode of the third transistor 300, the gate electrode of the third transistor 300, and the signal input electrode of the second transistor 200 may be electrically connected to realize the series connection of the third transistor 300 and the second transistor 200. The signal output electrode of the second transistor 200 and the signal output electrode of the fourth transistor 400 may be both electrically connected to the signal receiving component 106.

By providing a control signal to the gate electrodes of the first transistor 100 and the fourth transistor 400, an input signal may be provided to the signal input terminal of the first transistor 100, and the input signal may cause the potential of the signal input electrode of the first transistor 100 to be greater than the potential of the signal receiving component 106, the first transistor 100 and the fourth transistor 400 may be turned on, thereby charging the signal receiving component 106. In the early stage of the charging process, the increase of carriers in the active layer 103 may be suppressed through the signal output electrode 1052 of the first transistor 100, thereby achieving the purpose of suppressing the kink effect during the charging process. During the process of charging the signal receiving component 106, the potential of the signal output electrode 1052 of the first transistor 100 may gradually rise, and the Vds of the first transistor 100 (the voltage between the signal input electrode 1051 of the first transistor 100 and the signal output electrode 1052 of the first transistor 100) may gradually decrease, making the charging process smoother.

By providing control signals to the gates of the third transistor 300 and the second transistor 200, an input signal may be provided to the signal input terminal of the third transistor 300, the input signal may be smaller than the current potential of the signal receiving component 106, that is, the potential of the signal input electrode of the second transistor 200 may be lower than the potential of the signal receiving component 106, and the second transistor 200 and the third transistor 300 may be turned on to discharge the signal receiving component 106. In the early stage of the discharge process, the growth of carriers in the active layer 103 may be suppressed through the signal input electrode 1051 of the second transistor 200, thereby achieving the purpose of suppressing the kink effect during the discharge process. During the process of discharging the signal receiving component 106, the potential of the signal input electrode 1051 of the second transistor 200 may gradually rise, and the Vds of the second transistor 200 (the voltage between the signal input electrode 1051 of the second transistor 200 and the signal output electrode 1052 of the second transistor 200) may gradually decrease, making the discharge process smoother.

Figure 10:
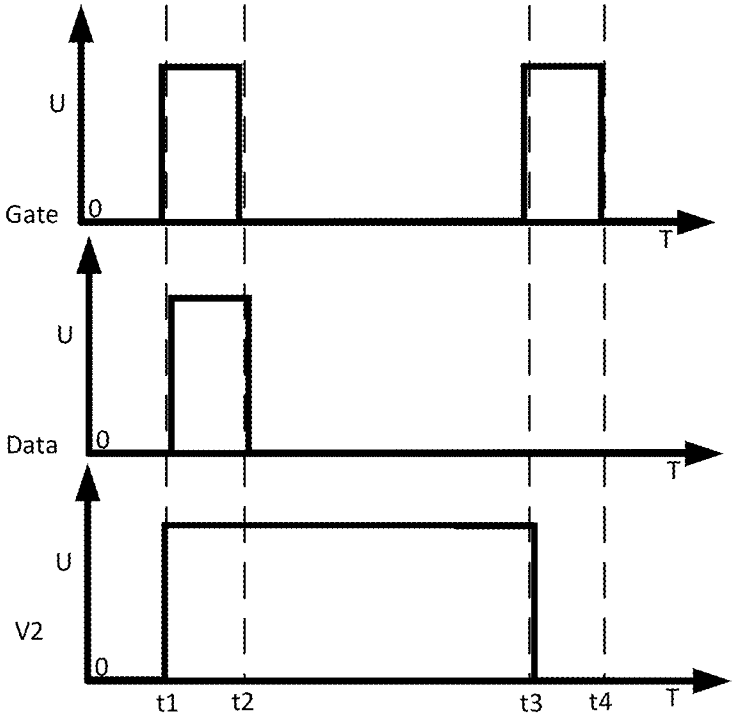
FIG. 10 illustrates another exemplary time sequence according to various disclosed embodiments of the present disclosure.

FIG. 10 is another exemplary time sequence diagram according to various disclosed embodiments of the present disclosure. As shown in FIG. 10, Gate3 may be the control signal of the gate of each transistor, Data3 may be the input signal of the signal input electrode of the first transistor 100 and the third transistor 300, and V2 may be referred to as the potential of the signal output component. As shown in FIG. 10, a high-level signal may be applied to the gate of the first transistor 100, as shown in t1-t2 in FIG. 10. At this time, the first transistor 100 and the fourth transistor 400 may be turned on, and the third transistor 300 and the second transistor 200 may be turned off. As shown in t3-t4 in FIG. 10, at this time, the third transistor 300 and the second transistor 200 may be turned on, and the first transistor 100 and the fourth transistor 400 may be turned off.

In one embodiment of the present disclosure, by adding the third transistor and the fourth transistor, when the input signal is greater than the potential of the signal receiving component, the first transistor and the fourth transistor may be turned on. When the input signal is less than the potential of the signal receiving component, the third transistor and the second transistor may be turned on. Therefore, it may be possible to suppress the kink effect during charging and discharging of the signal receiving component by using a set of control signals and input signals.

Figure 11:
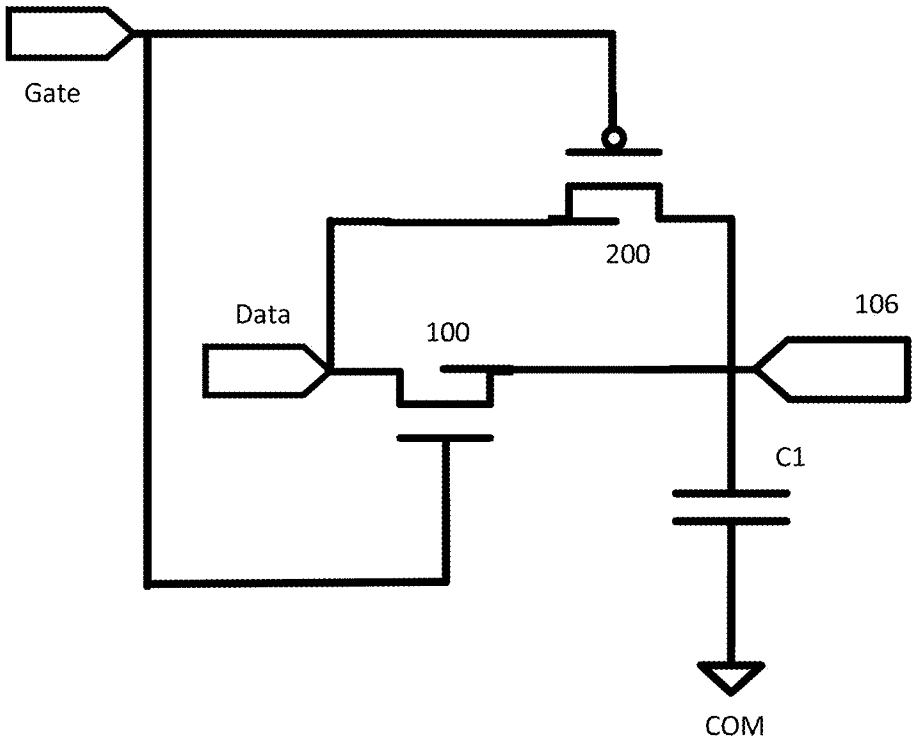
FIG. 11 illustrates another equivalent circuit of an exemplary thin-film transistor structure according to various disclosed embodiments of the present disclosure.

FIG. 11 is a schematic equivalent circuit diagram of another exemplary thin-film transistor structure according to various disclosed embodiments of the present disclosure. As shown in FIG. 11, in some embodiments, the signal output electrode of the first transistor 100 may be electrically connected to the signal output electrode of the second transistor 200; the signal input electrode of the first transistor 100 may be electrically connected to the signal input electrode of the second transistor 200; the gate electrode of the first transistor 100 may be electrically connected to the gate electrode of the second transistor 200; and the channel conductivity types of the first transistor 100 and the second transistor 200 may be opposite.

In one embodiment, the transistor structure may be divided into P-type transistors and N-type transistors. For P-type transistors, when Vgs is less than the threshold voltage, the P-type transistor may be turned on. For N-type transistors, when Vgs is greater than the threshold voltage, the N-type transistor may be turned on. The opposite channel conductivity types may indicate that the electrical signals used to turn on the first transistor 100 and the second transistor 200 may be different. For example, the first transistor 100 may be turned on by a high-level, and the second transistor 200 may be turned on by a low-level. In some embodiments, the first transistor 100 may be turned on by a low-level, and the second transistor 200 may be turned on by a high-level, which is not specifically limited here.

Taking FIG. 11 as an example, the first transistor 100 in FIG. 11 may be an N-type transistor, and the second transistor 200 may be a P-type transistor. When the potential of the signal input electrode of the first transistor 100 is greater than the potential of the signal receiving component 106, the signal receiving component 106 may be charged. At this time, high-level signals may be provided to the gate electrode of the first transistor 100 and the gate electrode of the second transistor 200. Because the first transistor 100 may be an N-type transistor, it may be turned on under the control of the high-level signal. The second transistor 200 may be a P-type transistor, so it may be turned off under the control of the high-level signal. During the process of charging the signal receiving component 106, because the overlapping area of the signal output electrode of the first transistor 100 and the etching barrier layer 104 may be greater than the overlapping area of the signal input electrode of the first transistor 100 and the etching barrier layer 104, the active layer 103 of the first transistor 100 may be more controlled by the signal output electrode of the first transistor 100, and because the potential of the signal output electrode of the first transistor 100 may be relatively low at this time, the increase of carriers in the active layer 103 may be suppressed through the signal output electrode of the first transistor 100, thereby achieving the purpose of suppressing the kink effect during the charging process.

During the process of discharging the signal receiving component 106, because the overlapping area of the signal input electrode of the second transistor 200 and the etching barrier layer 104 may be smaller than the overlapping area of the signal output electrode of the second transistor 200 and the etching barrier layer 104, the active layer 103 of the second transistor 200 may be more controlled by the signal input electrode of the second transistor 200. Because the potential of the signal input electrode of the second transistor 200 may be relatively low at this time, the increase of carriers in the active layer 103 may be suppressed by the signal input electrode of the second transistor 200 in this process, and the purpose of suppressing the kink effect during the discharge process may be achieved.

Figure 12:
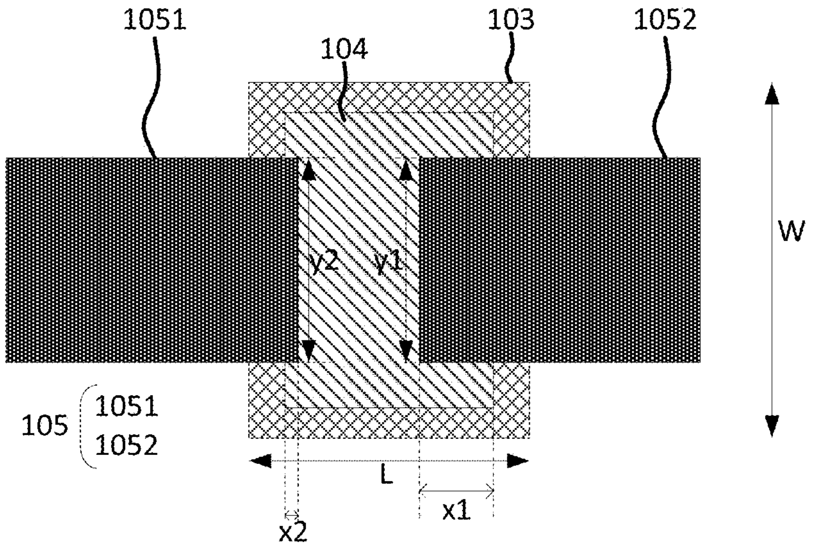
FIG. 12 illustrates an exemplary channel structure according to various disclosed embodiments of the present disclosure.

FIG. 12 is a schematic structural diagram of an exemplary channel region according to various embodiments of the present disclosure. As shown in FIG. 12, in some embodiments, along the length and/or width direction of the channel region 1032, the overlapping length of the signal output electrode 1052 of the first transistor 100 and the etching barrier layer 104 may be greater than the overlapping length and/or width of the signal input electrode 1051 of the first transistor 100 and the etching barrier layer 104. Along the length and/or width direction of the channel region 1032, the overlapping length of the signal input electrode 1051 of the second transistor 200 and the etching barrier layer 104 may be greater than the overlapping length of the signal output electrode 1052 of the first transistor 100 and the etching stop layer 104.

Figure 13:
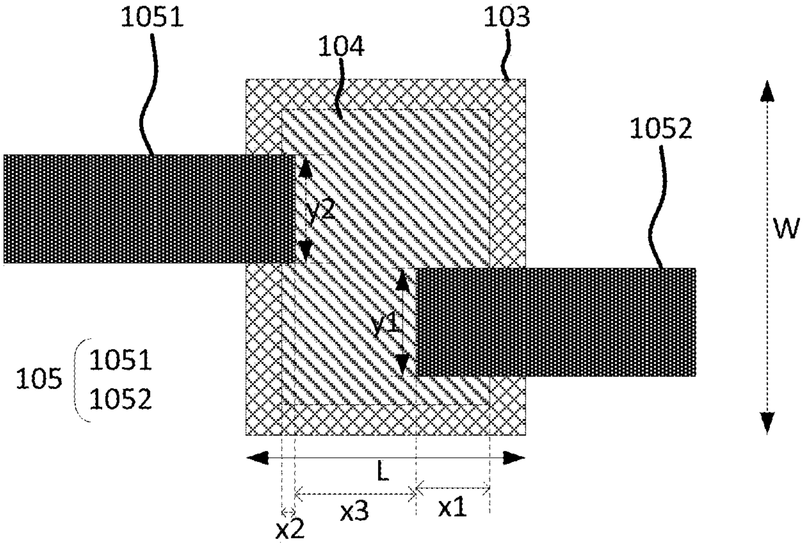
FIG. 13 illustrates another exemplary channel structure according to various disclosed embodiments of the present disclosure.

Referring to FIG. 12, L in the figure may represent the length direction of the channel region 1032, and W may represent the width direction of the channel region 1032. FIG. 13 only takes the first transistor 100 as an example for explanation. x1 may represent the overlapping length of the signal output electrode 1052 of the first transistor 100 and the etching barrier layer 104 in the width direction of the channel region 1032. x2 may represent the overlapping length of the signal output electrode 1052 of the first transistor 100 and the etching barrier layer 104 in the width direction of the channel region 1032. y1 may represent the overlapping length of the signal output electrode 1052 of the first transistor 100 and the etching barrier layer 104 in the length direction of the channel region 1032. y2 may represent the overlapping length of the signal input electrode 1051 of the first transistor 100 and the etching barrier layer 104 in the length direction of the channel region 1032. It should be noted that the exemplary setting in FIG. 12 may be $x1>x2$ and $y1=y2$. If $x1=x2$ and $y1>y2$, then the overlapping area of the signal output electrode 1052 of the first transistor 100 and the etching barrier layer 104 may be greater than the overlapping area of the signal input electrode 1051 of the first transistor 100 and the etching barrier layer 104. Or if $x1>x2$ and $y1=y2$, it may also be realized that the overlapping area of the signal output electrode 1052 and the etching barrier layer 104 of the first transistor 100 is greater than the overlapping area of the signal input electrode 1051 and the etching barrier layer 104 of the first transistor 100. In other embodiments, $x1>x2$ and $y1>y2$. In some embodiments, $x1<x2$ and $y1>y2$, or $x1>x2$, $y1<y2$. Such configurations may all realize that the overlapping area of the signal output electrode 1052 of the first transistor 100 and the etching barrier layer 104 may be greater than the overlapping area of the signal input electrode 1051 of the first transistor 100 and the etching barrier layer 104. Such conditions for the second transistor 200 may be similar to the first transistor 100, and will not be described again here.

FIG. 13 is a schematic diagram of another exemplary channel region according to various disclosed embodiments of the present disclosure. As shown in FIG. 13, in some embodiments, in the length direction of the channel region 1032, the overlapping area between the signal output electrode 1052 of the first transistor 100 and the etching barrier layer 104 may be greater than the overlapping length of the signal input electrode 1051 of the first transistor 100 and the etching barrier layer 104; in the length direction of the channel region 1032, the overlapping length of the signal input electrode 1051 of the second transistor 200 and the etching barrier layer 104 may be greater than the overlapping length of the signal output electrode 1052 of the first transistor 100 and the etching barrier layer 104; and in the width direction of the channel region 1032, the signal input electrode 1051 and the signal output electrode 1052 of the drain metal layer 105 may be arranged in sequence.

FIG. 13 only takes the first transistor 100 as an example, after increasing the overlapping length of the signal output electrode 1052 of the first transistor 100 and the etching barrier layer 104, the distance between the signal output electrode 1052 and the signal input electrode 1051 of the first transistor 100 in the horizontal direction may be reduced, represented as x3 in FIG. 13. When x3 is reduced, the capacitance effect formed between the signal input electrode 1051 and the signal output electrode 1052 of the first transistor 100 may become more obvious, which may cause the abnormal performance of the first transistor 100. To solve such an issue, along the channel region 1032, the signal input electrode 1051 and the signal output electrode 1052 of the drain metal layer 105 may be arranged in sequence in the width direction of the channel region 1032. For example, the signal input electrode 1051 and the signal output electrode 1052 of the drain metal layer 105 may not be arranged on the same straight line to reduce the capacitance coupling problem caused by the close distance between the signal input electrode 1051 and the signal output electrode 1052 of the drain metal layer 105. It should be noted that the structural arrangement of the second transistor 200 may be similar to that of the first transistor 100 and will not be described again here.

Figure 14:
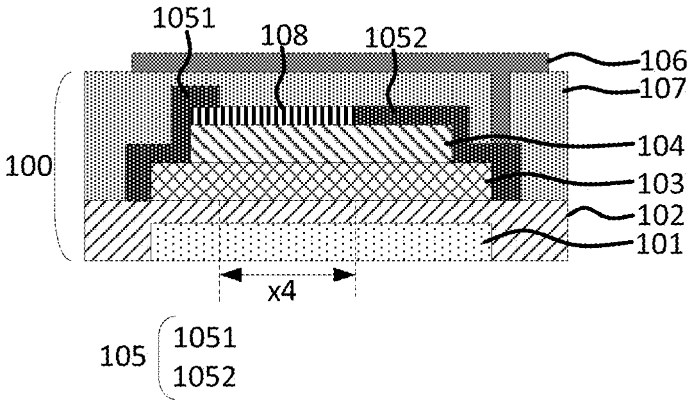
FIG. 14 illustrates another exemplary thin-film transistor structure according to various disclosed embodiments of the present disclosure.

FIG. 14 is a schematic structural diagram of another exemplary thin-film transistor structure according to various disclosed embodiments of the present disclosure. As shown in FIG. 14, in some embodiments, the signal input electrode 1051 and the signal output electrode 1052 of the drain metal layer 105 may be located on different film layers.

Taking the first transistor 100 as an example, as described in the embodiment corresponding to FIG. 14, after increasing the overlap length of the signal output electrode 1052 of the first transistor 100 and the etching barrier layer 104, the distance between the signal output electrode 1052 and the signal input electrode 1051 of the first transistor 100 in the horizontal direction may be reduced, illustrated as x4 in FIG. 14. When x4 is reduced, the capacitance effect formed between the signal input electrode 1051 and the signal output electrode 1052 of the first transistor 100 may become more obvious, which may cause the abnormal performance of the transistor. In other embodiments, the signal input electrode 1051 and the signal output electrode 1052 of the first transistor 100 may also be provided on different film layers. Therefore, there may be no inductive capacitance between the signal input electrode 1051 and the signal output electrode 1052 of the first transistor 100, and the impact on the first transistor 100 may be reduced. The second transistor 200 may be similar to the first transistor 100, and will not be described again here. 108 in FIG. 14 may represent a first insulation layer. In one embodiment, the first insulation layer 108 may be formed after the signal output electrode 1052 is formed, and then the signal input electrode 1051 may be formed such that the signal input electrode 1051 and the signal output electrode 1052 may be on different film layers.

In some embodiments, the active layer 103 of the first transistor 100 and/or the second transistor 200 may include a metal oxide semiconductor. For example, the material of the active layer 103 may be a metal oxide semiconductor, such as indium gallium zinc oxide (IGZO), etc. For the IGZO TFT, it has the characteristics of low leakage and high mobility and can be used in technical fields such as microfluidics and electronic paper. The voltage corresponding to the working scenarios in the above technical fields may be higher and it may be easier to produce the kink effects. The kink effect may be reduced through the thin-film transistor structure provided by the embodiments of the present disclosure.

In some embodiments, the ratio of the overlapping area of the signal output electrode 1052 of the first transistor 100 and the etching barrier layer 104 to the overlapping area of the signal input electrode 1051 of the first transistor 100 and the etching barrier layer 104 may range from 1 to 2; and the ratio of the overlapping area of the signal input electrode 1051 of the second transistor 200 and the etching barrier layer 104 to the overlapping area of the signal output electrode 1052 of the second transistor 200 and the etching barrier layer 104 may range from 1 to 2.

Taking the first transistor 100 as an example, the larger the ratio ranges, the signal output electrode 1052 of the first transistor 100 may control a larger area of the active layer 103, which may be beneficial to suppress the increase of the carriers in the active layer 103 through the signal output electrode 1052 of the first transistor 100; and it may be beneficial to suppressing the kink effect. On the other hand, due to the limitations of the manufacturing process, the overlapping area of the signal output electrode 1052 of the first transistor 100 and the etching barrier layer 104, and the overlapping area of the signal input electrode 1051 of the first transistor 100 and the etching barrier layer 104 may both have lower limits. Assuming that the overlapping area of the signal input electrode 1051 of the first transistor 100 and the etching barrier layer 104 is a, if the ratio range is increased, the overlapping area of the signal output electrode 1052 of the first transistor 100 and the etching barrier layer 104 may need to be increased. Generally, the overlapping length of the signal output electrode 1052 of the first transistor 100 and the etching barrier layer 104 may be increased in the length direction of the channel layer. In this case, the distance between the signal output electrode 1052 and the signal input electrode 1051 of the first transistor 100 may become smaller, which may increase the induction capacitive effect and affect the performance of the first transistor 100. In one embodiment, the ratio range may be limited to between 1 and 2, while effectively suppressing the kink effect, the impact of the inductive capacitance on the performance of the thin-film transistor structure may be reduced.

The present disclosure also provides an electronic device. The electronic device may include a thin-film transistor structure as in any one of the thin-film transistor structures in the previous embodiments.

The electronic device provided by the present disclosure may include a thin-film transistor structure as in any of the above embodiments. Therefore, the electronic device provided by the embodiments of the present disclosure may also achieve the same technical effects as the above thin-film transistor structures, which will not be discussed here.

Figure 15:
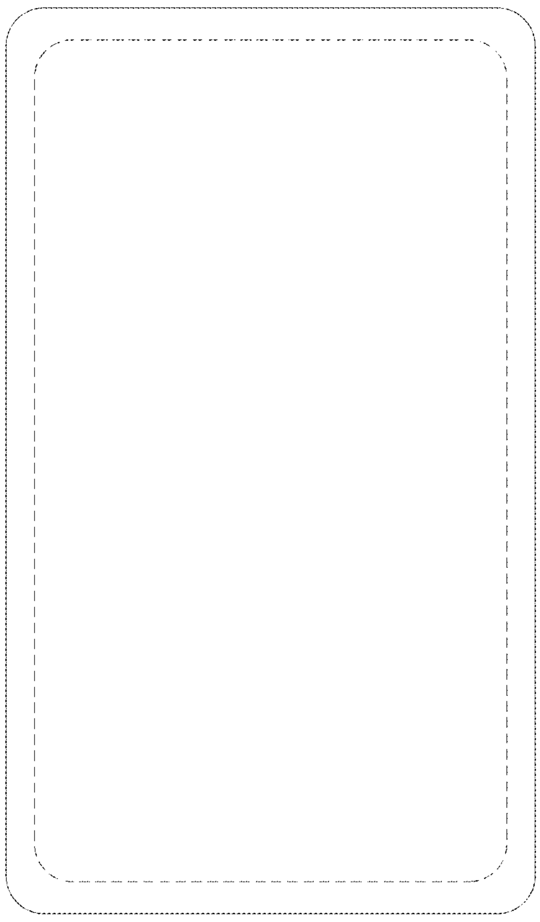
FIG. 15 illustrates an exemplary display panel according to various disclosed embodiments of the present disclosure.

In some embodiments, the electronic device may include a display panel. FIG. 15 is a schematic structural diagram of an exemplary display panel according to various disclosed embodiments. As shown in FIG. 15, the display panel may include a pixel driving circuit, and the pixel driving circuit may include the thin-film transistor structure described in any of the above embodiments.

The thin-film transistor structure in the pixel-driving circuit may be used to provide electrical signals to the pixel unit to drive the pixel unit to display. If the thin-film transistor structure produces a kink effect, the sharp increase in current may also cause the pixel unit to display abnormally, affecting the user's experience. With the thin-film transistor structure provided in the embodiments of the present disclosure, because the kink effect may be avoided, the abnormal display of the pixel unit may be avoided. The above example is only a possible scenario, after the kink effect occurs in the thin-film transistor structure, other effects may also be caused. The embodiments of this disclosure cannot list them all, but it is understandable that, because the thin-film transistor structure may avoid the kink effect, the impact of the kink effect may also be avoided.

In some embodiments, the signal receiving component 106 may include a pixel electrode. The first transistor 100 and the second transistor 200 may be used to transmit electrical signals to the pixel electrode. The signal input electrode 1051 of the first transistor 100 and/or the signal input electrode 1051 of the second transistor 200 may be electrically connected to the data signal of the display panel.

In one embodiment, the electronic device may be an LCD panel. In the LCD panel, the rotation of liquid crystal molecules may be controlled through pixel electrodes to transmit or block light, thereby causing the pixel unit to emit specific light or does not emit light. In one embodiment of the present disclosure, the first transistor 100 and the second transistor 200 may transmit electrical signals to the pixel electrode, and the data signal of the display panel may provide electrical signals to the pixel electrode through the first transistor 100 and/or the second transistor 200. The thin-film transistor structure provided in the disclosure may avoid the kink effect of the thin-film transistor and improve the voltage resistance of the thin-film transistor. Therefore, the display abnormality problem caused by the kink effect of the thin-film transistor may be avoided.

In some embodiments, the pixel driving circuit may include a light-emitting element, a driving module and a switching module. The driving module may be used to provide the driving current for the light-emitting element. The switching module may be used to selectively allow the light-emitting element to enter the light-emitting stage. The driving module and/or the switching modules may include the thin-film transistor structures.

In one embodiment, the electronic device provided by the embodiment of the present disclosure may also be an OLED display panel. In the OLED display panel, the light-emitting unit may be controlled to emit light by driving the light module and the switch module. During this process, both the switch module and the driving module may produce a kink effect, causing the light-emitting unit to emit abnormal light, which may in turn cause the OLED display panel to display abnormally. With the thin-film transistor structure provided in this disclosure, because the kink effect may be avoided, the abnormal display of the OLED display panel may be avoided.

Figure 16:
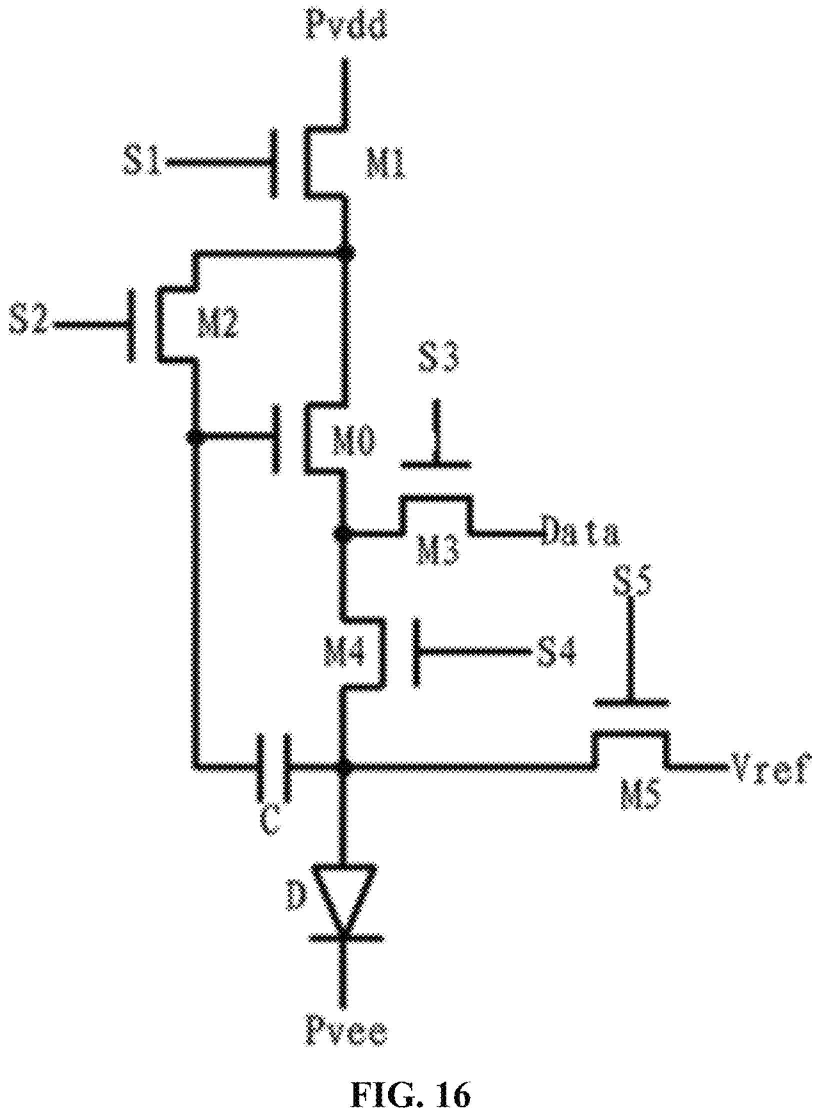
FIG. 16 illustrates an exemplary pixel driving circuit according to various disclosed embodiments of the present disclosure.

FIG. 16 is a schematic structural diagram of an exemplary pixel driving circuit according to various disclosed embodiments of the present disclosure. As shown in FIG. 16, the pixel driving circuit may include a driving module, a switch module and a light-emitting element D. The driving module may include a thin-film transistor M0. The switch module may include a first thin-film transistor M1, a second thin-film transistor M2, a fourth thin-film transistor M4, and a fifth thin-film transistor M5. Further, the pixel driving circuit may also include a storage capacitor C.

The first transistor M1 may be controlled by the first driving signal S1 and may be configured to transmit the power supply voltage Pvdd to the first electrode of the driving transistor M0. The second transistor M2 may be controlled by the second driving signal S2 and may be used to connect the first electrode and the gate of the driving transistor M0. The third transistor M3 may be controlled by the third driving signal S3 for transmitting the data voltage Data to the second electrode of the driving transistor M0. The fourth transistor M4 may be controlled by the fourth driving signal S4 and may be configured to connect the second electrode of the driving transistor M0 and the second plate of the capacitor C, and transmit the driving current from the driving transistor M0 to the light-emitting element D. The first plate of the capacitor C may be electrically connected to the gate of the driving transistor M0. The fifth transistor M5 may be controlled by the fifth driving signal S5 and may be configured to transmit the reference voltage Vref to the second plate of the capacitor C. The driving transistor M0 may be used to determine the size of the driving current. The gate of the first transistor M1 may be connected to the first driving signal S1; the first electrode of the first transistor M1 may be connected to the power supply voltage Pvdd; and the second electrode of the first transistor M1 may be electrically connected to the first electrode of the driving transistor M0. The gate of the second transistor M2 may be connected to the second driving signal S2; the first electrode of the second transistor M2 may be electrically connected to the first electrode of the driving transistor M0. The second electrode of the second transistor M2 may be electrically connected to the gate of the driving transistor M0. The gate of the third transistor M3 may be connected to the third driving signal S3. The first electrode of the third transistor M3 may be connected to the data voltage Data, and the second electrode of the third transistor M3 may be electrically connected to the second electrode of the driving transistor M0. The gate of the fourth transistor M4 may be connected to the fourth driving signal S4; the first electrode of the fourth transistor M4 may be electrically connected to the second electrode of the driving transistor M0; and the second electrode of the fourth transistor M4 may be electrically connected to the second plate of the capacitor C and the light-emitting element D. The gate of the fifth transistor M5 may be connected to the fifth driving signal S5; the first electrode of the fifth transistor M5 may be connected to the reference voltage Vref, and the second electrode of the fifth transistor M5 may be electrically connected to the second plate of the capacitor C.

In one embodiment, the light-emitting element D may be a light-emitting diode, and the anode of the light-emitting element D may be electrically connected to the second electrode of the fourth transistor M4, the second electrode of the fifth transistor M5, and the second plate of the capacitor C. The cathode of the light-emitting element D may be connected to the cathode low potential Pvee. In one embodiment, the driving transistor M0 may be an N-type transistor, and the data voltage Data and the reference voltage Vref may be both smaller than the power supply voltage Pvdd. In some embodiments, the driving transistor may also be a P-type transistor, which is not specifically limited in the embodiments of the present disclosure and may need to be specifically designed according to the actual application.

The present disclosure also provides a method for driving the pixel driving circuit. The pixel driving circuit may be the pixel driving circuit shown in FIG. 16. The method may include an initialization stage, a compensation stage and a light-emitting stage.

In the initialization stage, the first driving signal S1 may control the first transistor M1 to be turned on, the second drive signal S2 may control the second transistor M2 to be turned on, and the fourth driving signal S4 may control the fourth transistor M4 to be turned off.

In the compensation stage, the first driving signal S1 may control the first transistor M1 to be turned off, the second driving signal S2 may control the second transistor M2 to be turned on, the third driving signal S3 may control the third transistor M3 to be turned on, and the fourth driving signal S4 may control the fourth transistor M4 to be turned off, and the fifth driving signal S5 may control the fifth transistor M5 to be turned on.

In the light-emitting stage, the first driving signal S1 may control the first transistor M1 to be turned on, the second driving signal S2 may control the second transistor M2 to be turned off, the third driving signal S3 may control the third transistor M3 to be turned off, the fourth driving signal S4 may control the fourth transistor M4 to be turned on, and the fifth driving signal S5 may control the fifth transistor M5 to be turned off.

It should be noted that FIG. 16 is only a schematic structural diagram of a pixel driving circuit provided by one embodiment of the present disclosure and does not limit the specific structure of the pixel driving circuit. In other embodiments, the structure of the pixel driving circuit may be selected according to actual need, such as the number of thin-film transistors, the number of capacitors, and the connection relationships between them.

In some embodiments, the electronic device may include a gate driving circuit including a thin-film transistor structure. The gate driving circuit may refer to a circuit that provides the scan signal Scan to the thin-film transistor in the pixel driving circuit. The gate driving circuit may be generally arranged in the non-display area on at least one side of the display area of the display panel and may include multiple cascaded shift registers. The gate driving circuit may provide, for example, the scanning signal S2 to the second thin-film transistor M2, the scanning signal S3 to the third thin-film transistor M3, and the scanning signal S5 to the fifth thin-film transistor M5 of the pixel driving circuit shown in FIG. 16.

In some embodiments, the electronic device may include a light-emission control driving circuit, and the light-emission control driving circuit may include a thin-film transistor structure. The light-emission control driving circuit may refer to a circuit that provides the light-emission control signal Emit to the light-emission control thin-film transistor of the pixel driving circuit. The light-emission control driving circuit may be generally arranged in the non-display area on at least one side of the display area of the display panel and may include multiple cascaded shift registers. For example, the light-emission control driving circuit may supply the light-emission control signal S4 to the fourth thin-film transistor M4 of the pixel driving circuit shown in FIG. 16 and provide the light-emission control signal S1 to the first thin-film transistor M1 of the pixel driving circuit shown in FIG. 16.

It should be noted that the electronic device provided by this disclosure may also be, for example, a microfluidic device, electronic paper, and other devices. If high-voltage signals need to be transmitted for a long time in the internal circuit of an electronic device, the thin-film transistor that transmits the high-voltage signal is prone to the kink effect. Therefore, the thin-film transistor structure provided in the embodiments of the present disclosure may be used to prevent the kink effect.

It should be noted that in this disclosure, relational terms such as "first" and "second" are only used to distinguish one entity or operation from another entity or operation, and do not necessarily require or imply there is such an actual relationship or sequence between entities or operations. Furthermore, the terms "comprises", "includes", or any other variations thereof are intended to cover a non-exclusive inclusion such that a process, method, article, or apparatus that includes a list of elements including not only those elements, but also those not expressly listed other elements, or elements inherent to the process, method, article or equipment. Without further limitation, an element defined by the statement "comprises a . . . " does not exclude the presence of additional identical elements in a process, method, article, or apparatus that includes the stated element.

The present disclosure provides a thin-film transistor structure and an electronic device. The thin-film transistor structure provided may include a first transistor and a second transistor. For the first transistor, the overlapping area of the signal output electrode and the etching barrier layer may be greater than the overlapping area of the signal input electrode and the etching barrier layer. For the second transistor, the overlapping area of the signal input electrode and the etching barrier layer may be greater than the overlapping area of the signal output electrode and the etching barrier layer. When applying the thin-film transistor structure provided in this disclosure to provide an electrical signal to the signal receiving component, if the potential of the signal input electrode of the first transistor is greater than the potential of the signal receiving component, the first transistor may be turned on. For the first transistor, because its level on the signal output electrode side may be low, based on the fact that the overlapping portion of the signal output electrode and the etching barrier layer in the first transistor may form a top gate on the active layer, some holes in the channel layer may be attracted to achieve the purpose of reducing the carrier concentration in the active layer of the first transistor, suppressing the increase in drain current of the first transistor, and thereby suppressing the kink effect during the charging process of the signal receiving component.

If the potential of the signal input electrode of the second transistor is lower than the potential of the signal receiving component, the second transistor may be turned on. For the second transistor, because the level on the signal input electrode side may be relatively low, it may be equivalent to the potential of the signal receiving component being lower than the provided potential. Thus, because the portion of the signal input electrode of the second transistor overlapping with the etching barrier layer may form a top gate on the active layer, some holes in the channel layer may be attracted to reduce the carrier concentration in the active layer of the second transistor and suppress the increase in drain current of the second transistor, thereby achieving the purpose of suppressing the kink effect during the discharge process of the signal receiving component. To sum up, the thin-film transistor structure provided by this disclosure may suppress the kink effect and improve the performance of the thin-film transistor structure.

The above descriptions are only specific embodiments of the present disclosure, enabling those skilled in the art to understand or implement the present disclosure. Various modifications to these embodiments will be readily apparent to those skilled in the art, and the generic principles defined herein may be practiced in other embodiments without departing from the spirit or scope of the disclosure. Therefore, the present disclosure is not to be limited to the embodiments described herein but is to be accorded the widest scope consistent with the principles and novel features disclosed herein.

What is claimed is:

1. A thin-film transistor structure, comprising:

a first transistor; and a second transistor, wherein:

each of the first transistor and the second transistor includes a gate electrode, a gate insulation layer, an active layer, an etching barrier layer, and a drain metal layer; the gate insulation layer is located above the gate metal layer, the active layer is located above the gate insulation layer, the etching barrier layer is located above the active layer, the drain metal layer is located above the active layer, and the drain metal layer is located above the etching barrier layer; the active layer includes a first connection area, a channel area and a second connection area; the first connection area is in contact with a signal input electrode of the drain metal layer, and the second connection area is in contact with a signal output electrode of the drain metal layer;

the first transistor and the second transistor are configured to transmit electrical signals to a signal receiving component, a potential of a signal input electrode of the first transistor is greater than a potential of the signal receiving component, and the first transistor is turned on; and a potential of a signal input electrode of the second transistor is less than a potential of the signal receiving component, and the second transistor is turned on; and an overlapping area of the signal output electrode of the first transistor and the etching barrier layer is greater than an overlapping area of the signal input electrode of the first transistor and the etching barrier layer, and an overlapping area of the signal input electrode of the second transistor and the etching barrier layer is larger than an overlapping area of the signal output electrode of the second transistor and the etching barrier layer.

2. The thin-film transistor structure according to claim 1, wherein:

the signal output electrode of the first transistor is connected to the signal input electrode of the second transistor; and the gate electrodes of the first transistor and the second transistor are electrically connected together.

3. The thin-film transistor according to claim 1, wherein:

the signal output electrode of the first transistor is electrically connected to the signal output electrode of the second transistor;

the signal input electrode of the first transistor is configured to receive a first voltage signal;

the signal input electrode of the second transistor is configured to receive a second voltage signal;

the gate electrode of the first transistor is configured to receive a first control signal; and the gate electrode of the second transistor is configured to receive a second control signal.

4. The thin-film transistor structure according to claim 1, further comprising:

a third transistor, wherein a signal output electrode of the third transistor, a gate electrode of the third transistor and the signal input electrode of the second transistor are electrically connected together; and a fourth transistor, wherein a signal input electrode of the fourth transistor, a gate electrode of the fourth transistor and the signal output electrode of the first transistor are electrically connected together, wherein:

a signal input electrode of the third transistor is electrically connected to the signal input electrode of the first transistor;

the signal output electrode of the second transistor is electrically connected to a signal output electrode of the fourth transistor; and the potential of the signal input electrode of the first transistor is greater than the potential of the signal receiving component, the first transistor is turned on and the fourth transistor is turned on, and the potential of the signal input electrode of the first transistor is less than the potential of the signal receiving component, the second transistor and the third transistor are turned on.

5. The thin-film transistor structure according to claim 1, wherein:

the signal output electrode of the first transistor is electrically connected to the signal output electrode of the second transistor;

the signal input electrode of the first transistor is electrically connected to the signal input electrode of the second transistor;

the gate electrode of the first transistor is electrically connected to the gate electrode of the second transistor; and conductivity types of channels of the first transistor and the second transistor are opposite.

6. The thin-film transistor structure according to claim 1, wherein:

in a length and/or width direction of the channel area, an overlapping length of the signal output electrode of the first transistor and the etching barrier layer is greater than an overlapping length of the signal input electrode of the first transistor and the etching barrier layer; and in the length and/or width direction of the channel area, the overlapping length of the signal input electrode of the second transistor and the etching barrier layer is greater than the overlapping length of the signal output electrode of the first transistor and the etching barrier layer.

7. The thin-film transistor structure according to claim 6, wherein:

in the length direction of the channel area, the overlapping length of the signal output electrode of the first transistor and the etching barrier layer is greater than the overlapping length of the signal input electrode of the first transistor and the etching barrier layer;

in the length direction of the channel area, the overlapping length of the signal input electrode of the second transistor and the etching barrier layer is greater than the overlapping length of the signal output electrode of the first transistor and the etching barrier layer; and in the width direction of the channel area, the signal input electrode and the signal output electrode of the drain metal layer are sequentially disposed.

8. The thin-film transistor structure according to claim 1, wherein:

the signal input electrode and the signal output electrode of the drain metal layer are disposed in different layers.

9. The thin-film transistor structure according to claim 1, wherein:

the active layer of the first transistor and/or the second transistor includes a metal oxide semiconductor.

10. The thin-film transistor structure according to claim 1, wherein:

a ratio of the overlapping area of the signal output electrode of the first transistor and the etching barrier layer to the overlapping area of the signal input electrode of the first transistor and the etching barrier layer ranges from approximately 1 to 2; and a ratio of the overlapping area of the signal input electrode of the second transistor and the etching barrier layer to the overlapping area of the signal output electrode of the second transistor and the etching barrier layer ranges from approximately 1 to 2.

11. An electronic device, comprising:

a thin-film transistor structure, including:

a first transistor; and a second transistor, wherein:

each of the first transistor and the second transistor includes a gate electrode, a gate insulation layer, an active layer, an etching barrier layer and a drain metal layer; the gate insulation layer is located above the gate metal layer, the active layer is located above the gate insulation layer, the etching barrier layer is located above the active layer, the drain metal layer is located above the active layer, and the drain metal layer is located above the etching barrier layer; the active layer includes a first connection area, a channel area and a second connection area; the first connection area is in contact with a signal input electrode of the drain metal layer, and the second connection area is in contact with a signal output electrode of the drain metal layer;

the first transistor and the second transistor are configured to transmit electrical signals to a signal receiving component, a potential of the signal input electrode of the first transistor is greater than a potential of the signal receiving component, and the first transistor is turned on, and a potential of the signal input electrode of the second transistor is less than a potential of the signal receiving component, and the second transistor is turned on; and an overlapping area of the signal output electrode of the first transistor and the etching barrier layer is greater than an overlapping area of the signal input electrode of the first transistor and the etching barrier layer, and an overlapping area of the signal input electrode of the second transistor and the etching barrier layer is larger than an overlapping area of the signal output electrode of the second transistor and the etching barrier layer.

12. The electronic device according to claim 11, comprising:

a display panel, wherein the display panel includes a pixel driving circuit and the pixel driving circuit includes the thin-film transistor structure.

13. The electronic device according to claim 12, wherein the signal receiving component comprises:

a pixel electrode, wherein the first transistor and the second transistor are configured to transmit electrical signals to the pixel electrode and the signal input electrode of the first transistor and/or the signal input electrode of the second transistor are electrically connected to data signal of the display panel.

14. The electronic device according to claim 12, wherein the pixel driving circuit comprises:

a light-emitting element;

a driving module; and a switch module, wherein:

the driving module is configured to provide a driving current for the light-emitting element;

the switch module is configured to selectively allow the light-emitting element to enter a light-emitting stage; and the driving module and/or the switch module includes the thin-film transistor structure.

15. The electronic device according to claim 12, comprising:

a gate driving circuit including the thin-film transistor structure.

16. The electronic device according to claim 12, comprising:

a light-emission control driving circuit including the thin-film transistor structure.

* * * * *